US008912939B2

(12) United States Patent
Dempsey (10) Patent No.: US 8,912,939 B2
(45) Date of Patent: Dec. 16, 2014

(54) STRING DAC LEAKAGE CURRENT CANCELLATION (71) Applicant: Dennis A. Dempsey, Newport (IE)

(72) Inventor: Dennis A. Dempsey, Newport (IE)

(73) Assignee: Analog Devices Technology, Hamilton (BM)

( * ) Notice: Subject to any disclaimer, the term of this patent is extended or adjusted under 35 U.S.C. 154(b) by 0 days.

(21) Appl. No.: 13/839,801

(22) Filed: Mar. 15, 2013

(65) Prior Publication Data

US 2014/0167997 A1 Jun. 19, 2014

Related U.S. Application Data (60) Provisional application No. 61/737,458, filed on Dec. 14, 2012.

(51) Int. Cl.
*H03M 1/78* (2006.01)
*H03M 1/66* (2006.01)

(52) U.S. Cl.
CPC .................................. *H03M 1/66* (2013.01)
USPC ......................... 341/154; 341/144; 341/145

(58) Field of Classification Search
CPC .... H03M 1/785; H03M 1/808; H03M 1/0607
USPC .................................................. 341/144, 154
See application file for complete search history.

(56) References Cited

U.S. PATENT DOCUMENTS

| 4,338,591 | A | | 7/1982 | Tuthill |
| 4,491,825 | A | | 1/1985 | Tuthill |
| 4,543,560 | A | | 9/1985 | Holloway |
| 4,638,303 | A | | 1/1987 | Masuda et al. |
| 5,075,677 | A | | 12/1991 | Meaney et al. |
| 5,554,986 | A | * | 9/1996 | Neidorff ........................ 341/145 |
| 5,568,147 | A | | 10/1996 | Matsuda et al. |
| 5,739,782 | A | * | 4/1998 | Uda ............................... 341/154 |
| 5,764,174 | A | | 6/1998 | Dempsey et al. |
| 5,831,566 | A | * | 11/1998 | Ginetti ........................... 341/144 |
| 5,877,717 | A | | 3/1999 | Tu et al. |
| 5,940,020 | A | | 8/1999 | Ho |
| 5,969,657 | A | * | 10/1999 | Dempsey et al. ............. 341/145 |
| 6,191,720 | B1 | | 2/2001 | Zhang |
| 6,346,908 | B1 | | 2/2002 | Jones, III |
| 6,535,154 | B1 | | 3/2003 | Sculley |
| 6,914,547 | B1 | | 7/2005 | Swaroop et al. |
| 6,958,720 | B1 | | 10/2005 | Prater |
| 7,136,002 | B2 | * | 11/2006 | Dempsey et al. ............. 341/145 |
| 7,330,143 | B2 | | 2/2008 | Kim et al. |
| 7,342,527 | B2 | | 3/2008 | Tsuchi |
| 7,365,670 | B2 | | 4/2008 | Lan |
| 7,425,912 | B2 | | 9/2008 | Cosgrave |
| 7,474,245 | B1 | * | 1/2009 | Wang et al. .................... 341/145 |
| 7,639,166 | B2 | * | 12/2009 | Iijima ........................... 341/145 |
| 7,889,106 | B2 | | 2/2011 | Imai |
| 7,956,786 | B2 | | 6/2011 | Cosgrave |
| 2003/0048830 | A1 | * | 3/2003 | Dickerman et al. .......... 374/103 |

(Continued)

*Primary Examiner* — Linh Nguyen
(74) *Attorney, Agent, or Firm* — Kenyon & Kenyon LLP (57) ABSTRACT Embodiments of the present invention may provide a multi-string DAC with leakage current cancellation. A leakage cancellation circuit may be coupled to output node(s) of the— multi-string DAC. The leakage cancellation circuit may replicate leakage current present at the coupled output node(s) and generate a corresponding complementary signal, a leakage cancellation signal. The leakage cancellation signal may be injected into the coupled output node(s) to cancel (or reduce) the net impact of the leakage current.

18 Claims, 5 Drawing Sheets

(56) References Cited

U.S. PATENT DOCUMENTS

| | | | |
|---|---|---|---|
| 2003/0141998 A1* | 7/2003 | Matsui | 341/145 |
| 2006/0145904 A1 | 7/2006 | Kim | |
| 2007/0152860 A1* | 7/2007 | Jain | 341/144 |
| 2007/0296618 A1 | 12/2007 | Cosgrave et al. | |
| 2008/0180295 A1* | 7/2008 | Lan | 341/148 |
| 2009/0207059 A1 | 8/2009 | Wikner | |
| 2010/0182175 A1 | 7/2010 | Oo et al. | |
| 2010/0245145 A1* | 9/2010 | Motamed | 341/144 |
| 2011/0102227 A1 | 5/2011 | Motamed | |
| 2012/0049917 A1 | 3/2012 | Cook | |
| 2012/0146828 A1 | 6/2012 | Narathong et al. | |
| 2012/0326907 A1* | 12/2012 | Hirai | 341/154 |
| 2013/0076549 A1* | 3/2013 | Bajdechi et al. | 341/144 |

\* cited by examiner

STRING DAC LEAKAGE CURRENT CANCELLATION

CROSS-REFERENCE TO RELATED APPLICATION

This application claims the benefit of priority afforded by provisional U.S. Patent Application Ser. No. 61/737,458, filed Dec. 4, 2012, the content of which is incorporated herein.

BACKGROUND

The present invention relates to leakage current cancellation in string digital-to-analog converters (DACs).

String DACs convert a digital word into a corresponding analog signal. A dual string DAC, which is a string DAC type, includes two impedance strings such as two series connected resistor strings and two switch networks. The outputs of the first resistor string, which typically is used for converting the most significant bits (MSBs) of the digital word, is coupled to the input of the second resistor string, which typically is used for converting the least significant bits (LSBs) of the digital word. Thus, for medium-to-high resolution converters, the voltages at selected first resistor terminals are often close in value. The selected resistor in first resistor string, first switching network, and second resistor string may be operating at similar common-mode.

An error source in string DACs operating at a given common-mode is leakage current, which can corrupt the conversion. Leakage current can be present at the outputs of the switches in the two switch networks and can refer to the undesired current that "leaks" in to or from switch terminals. The impact of such leakage current becomes more substantial in low power and/or high temperature applications. In low power applications, small amounts of leakage current can lead to significant errors because of the low voltages used in the conversion. In high temperature applications, leakage current increases proportionally to increasing temperature (e.g., leakage current can substantially double every 10 degrees Celsius).

Therefore, the inventor recognized a need in the art for efficient leakage current cancellation.

DETAILED DESCRIPTION

Embodiments of the present invention may provide a string DAC with at least two pairs of impedance strings selectively coupled to each other via switches. The string DAC may also include a leakage cancellation circuit coupled to an output node to replicate a leakage current present at the output node, to generate a complementary signal of the leakage current and to output the complementary signal to the output node.

Embodiments of the present invention may provide a method for leakage current cancellation. The method may include detecting a voltage signal at an output node in a multi-string DAC, replicating a leakage current at the output node based on the detected voltage, generating a cancellation signal that is complementary to the leakage current, and outputting the cancellation signal so that the leakage current and the cancellation signal destructively interfere.

Figure 1A:
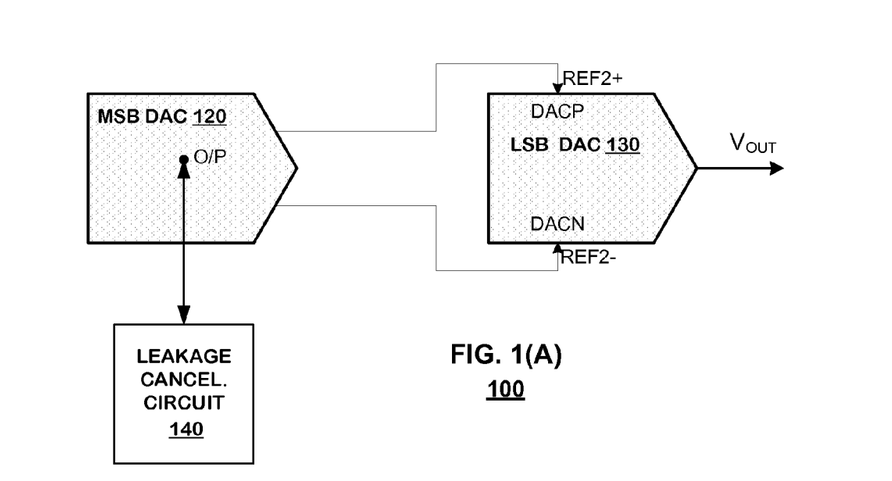
FIG. 1(A) illustrates a DAC system according to an embodiment of the present invention.

FIG. 1(A) illustrates a DAC system 100 with leakage current cancellation according to an embodiment of the present invention. The DAC system 100 may include an MSB DAC 120, an LSB DAC 130, and a current cancellation circuit 140. The DAC system 200 is shown as a binary system split between MSB and LSB portions; however, the DAC systems described herein may be implemented in a variety of different architectures and/or using different number systems (e.g., using relative primes) and/or using non-binary number base. The binary split system is used for simplicity and illustrative purposes herein. The DAC system 100 may convert input digital word $D_{IN}$ into a converted analog voltage $V_{OUT}$.

Figure 1B:
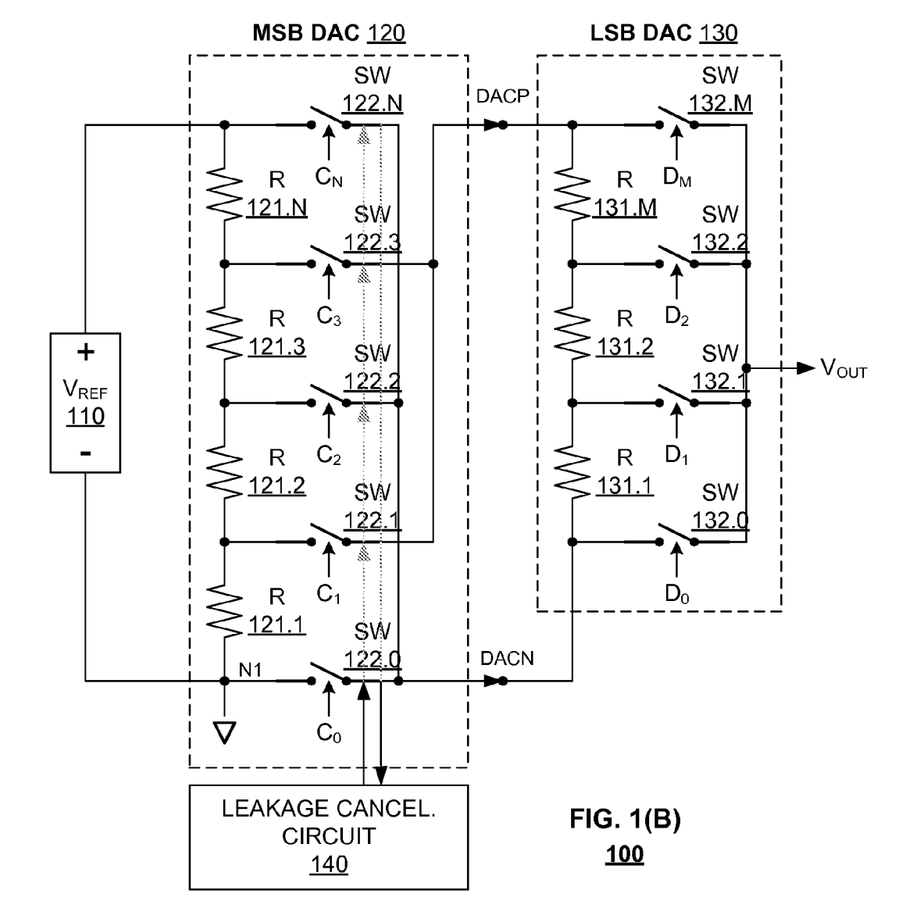
FIG. 1(B) illustrates a DAC system according to an embodiment of the present invention.

The MSB DAC 120 may convert MSB bits of a digital word to be converted to an analog voltage $V_{OUT}$. The MSB DAC 120 may include an impedance string with serially-coupled impedance structures such as resistors, MOS devices, etc. In an embodiment, the MSB DAC 120 may be provided as a string DAC as shown in FIG. 1(B). For example, the MSB DAC 120 may include a plurality of serially-coupled resistors 121.1-121.N (i.e., a resistor string) and a plurality of switches 122.0-122.N. The resistors 121.1-121.N in the resistor string may be provided with equal resistance (e.g., K ohms) to operate as a voltage divider network. The plurality of switches 122.0-122.N may be coupled to the ends of the resistors. Hence, the selective coupling of the switches may provide intermediate nodes corresponding to different sections in the resistor string. The switches may be controlled by binary control signals ($C_0$-$C_N$) based on the MSBs of the digital word to be converted. Thus, the MSB DAC 120 may provide a portion of reference voltage $V_{REF}$ scaled according to the MSBs of the input digital word.

The LSB DAC 130 may be coupled to the MSB DAC 120. The LSB DAC 130 may convert LSB bits of the digital word to be converted to $V_{OUT}$. The LSB DAC 130 may include an impedance string with serially-coupled impedance structures such as resistors, MOS devices, etc. For example, the LSB DAC 130 may be provided as a string DAC as shown in FIG. 1(B). In this embodiment, the LSB DAC 130 may include a plurality of serially-coupled resistors 131.1-131.M (i.e., a resistor string) and a plurality of switches 132.0-132.M. The resistors 131.1-131.M in the resistor string may be provided with equal resistance (e.g., L ohms) to operate as a voltage divider network. The outputs of the MSB DAC 120 may be coupled to a top and bottom end of the LSB DAC 130 resistor string. The plurality of switches 121.1-121.N may be coupled to the ends of the resistors. The switches may be controlled by binary control signals ($D_o$-$D_N$) based on the LSBs of the digital word to be converted.

The leakage cancellation circuit 140, in an embodiment, may be coupled to one or more MSB DAC 120 output nodes in a feedback loop. The leakage cancellation circuit 140 may measure current leakage from the respective MSB DAC 120 output node(s). Further, the leakage cancellation circuit 140 may generate a complementary signal to the measured current leakage—a leakage cancellation signal. The leakage cancellation circuit 140 may then transmit the leakage cancellation signal to the coupled output node(s). The leakage cancellation signal may combine with the current leakage at the output node(s) and may cancel each other out due to destructive interference.

In an embodiment, the leakage cancellation circuit 140 may be coupled either one of or both of the intermediate nodes coupling the MSB DAC 120 and LSB DAC 130, DACP and DACN. In an embodiment, the leakage cancellation circuit 140 may cancel leakage for a switch matrix in a multi-string DAC configuration. The switch matrix may couple two or more string segments of the multi-string DAC together. Furthermore, the switching stage (multiplexer) may be implemented in multiple stages such as in a two stage, row-column decoder in orthogonal arrays or one switch per bit multiplexer architectures.

Moreover, the DAC system 100 in FIG. 1(B) illustrates a dual-string DAC; however, the DAC system 100 may be expanded to include larger multi-string DAC configuration (e.g., three string, four string, etc.), and the leakage cancellation scheme described herein may be implemented with other DAC configurations. For example, the leakage current cancellation scheme may be used in conjunction with multi-string DAC architectures described in U.S. Pat. No. 5,969,657, U.S. Pat. No. 7,136,002, and U.S. Pat. No. 6,914,547. Hence, the leakage cancellation circuit may implement appropriate replica circuitry based on the DAC configuration to cancel the leakage current. The replica circuitry may vary to match changes in the leakage current, for example due to code dependency. The variation may be achieved via switching in, or coupling to, appropriate replica circuitry. Therefore, the leakage current cancellation circuit may take into account circuit component variations such as where NMOS switches are used at low common-mode levels and PMOS devices are used at high common-mode levels. The component variations may also be code dependent, and, thus, the leakage cancellation circuit may take that into account as well by dynamically adjusting based on present code input.

Figure 2:
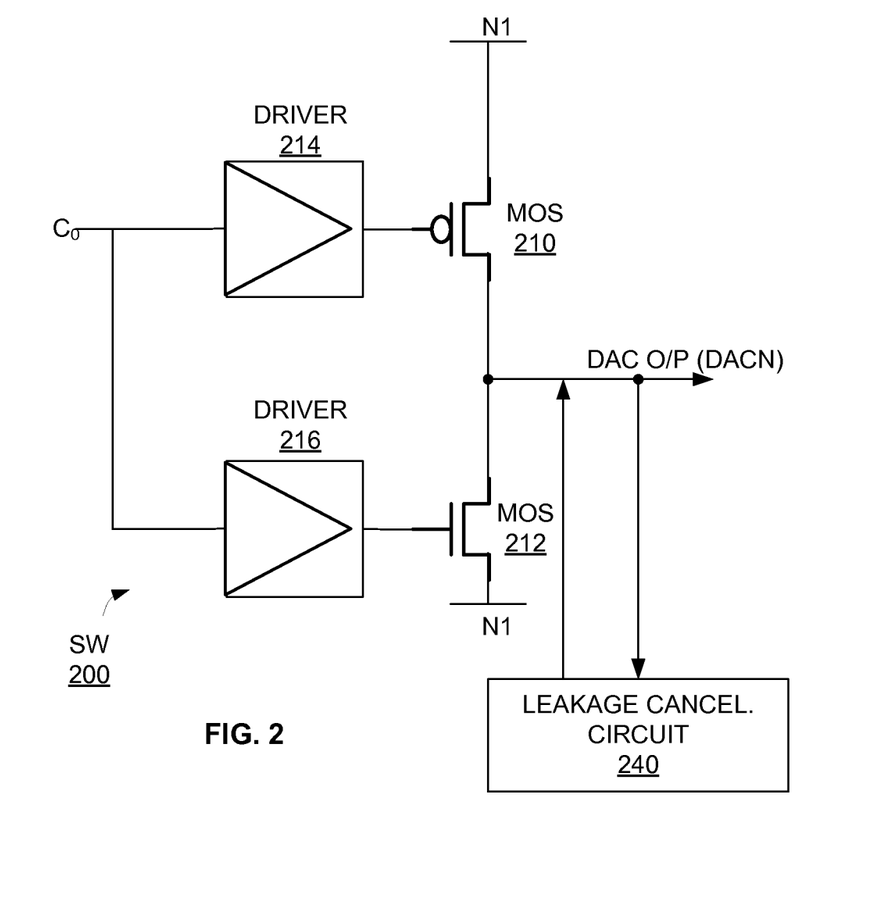
FIG. 2 illustrates an exemplary DAC output node with a coupled leakage cancellation circuit according to an embodiment of the present invention.

FIG. 2 illustrates an exemplary MSB DAC output node coupled to a leakage cancellation circuit according to an embodiment of the present invention. FIG. 2 may include a switch SW 200 and a leakage cancellation circuit 240. In an embodiment, the switch 200 may be implemented as switch 122.0 in MSB DAC 120 of FIG. 1 between nodes N1 and DACN. These switches may couple from nodes in the string to the string DAC outputs. The switch SW 200 may include a first MOS transistor 210, a second MOS transistor 212, a first driver 214, a second driver 216. MOS 210 may be a mosfet transistor, for example, a PMOS transistor. The source terminal may be coupled to the positive terminal of $V_{REF}$. MOS 212 may be a mosfet transistor, for example, a NMOS transistor. The source terminal may be coupled to the negative terminal of $V_{REF}$ or ground. The drain terminals of the MOS 210 and MOS 212 may be coupled to together to form the DAC output node. The MOS 210 and MOS 212 may be complementary transistors. For example, MOS 210 and MOS 212 may be provided as PMOS and NMOS transistors respectively or vice versa. In an embodiment, the first and second MOS 210, 212 may be provided as other suitable transistor types such as MOSFETs, MESFETs, etc.

The first driver 214 may be coupled to the gate of the first MOS 210 and may control the first MOS' 210 operations based on the control signal, for example $C_0$ in FIG. 1(B). The second driver 216 may be coupled to the gate of the second MOS 212 and may control the second MOS' 212 operations based on the control signal, for example $C_0$ in FIG. 1(B).

The leakage cancellation circuit 240 may be coupled to the DAC output node using a feedback loop. The leakage cancellation circuit 240 may detect and measure current leakage directly or indirectly from the coupled DAC output node. Further, the leakage cancellation circuit 240 may generate a complimentary signal to the measured current leakage—a leakage cancellation signal. The leakage cancellation circuit 240 may then transmit the leakage cancellation signal to the coupled output node. The leakage cancellation signal may combine with the current leakage such that the effect is seen at the output nodes and may cancel each other out due to destructive interference.

Whilst FIG. 2 shows one embodiment of the switch, it may also be realized by a single, suitable MOS device. The single MOS switch device may be made from an NMOS or PMOS of appropriate voltage rating, threshold type, gate insulator type (and thickness) optimized for switch performance. In an embodiment, the switch device may couple directly to the gate terminal of a switch device from the control logic (i.e., no embedded driver block). Also, other known variations of switches may be used in conjunction with the leakage cancellation scheme described herein. For example, in an embodiment, the switch SW 200 may be provided as taught in U.S. Pat. No. 5,764,174.

Figure 3:
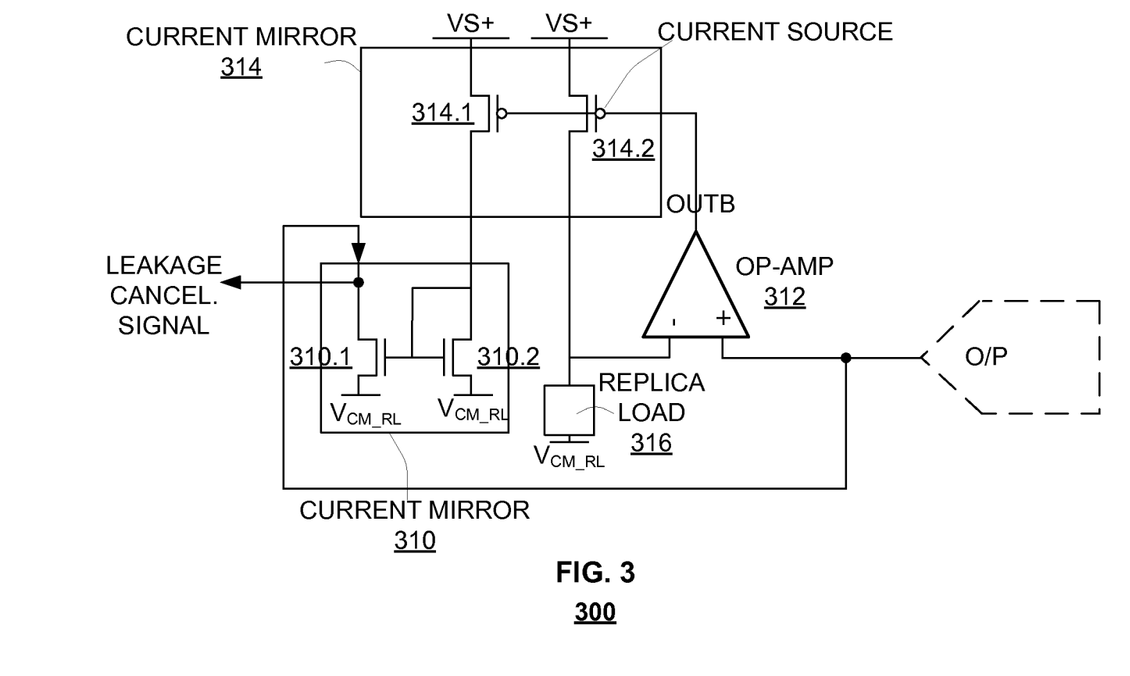
FIG. 3 illustrates a leakage cancellation circuit according to an embodiment of the present invention.

FIG. 3 illustrates a simplified circuit diagram of a leakage cancellation circuit 300 according to an embodiment of the present invention. The leakage cancellation circuit 300 may include an op-amp 312, current mirrors 310 and 314, and a replica load 316. A positive input terminal of op-amp 312 may be coupled to output node(s) as shown in FIG. 1 to receive the leakage current signal. Op-amp 312 output, OUTB, may be an inverted (complementary) signal of the leakage current signal out of the DAC output node(s).

The first current mirror 310 may include two transistors 310.1, 310.2. The transistors 310.1, 310.2 may be coupled together via their gate terminals. The transistor 310.2 may also have its gate coupled to its drain. In an embodiment, the current mirror 310 may be provided as an NMOS current mirror. In another embodiment, the current mirror 310 may be provided as a PMOS current mirror.

The second current mirror 314 may include two transistors 314.1, 314.2. The gate terminals of the transistors 314.1, 314.2 may be coupled to op-amp 312 output, OUTB. The transistors 314.1, 314.2 may be coupled and shorted together. The transistor 314.2 may also operate as a current source to supply the leakage current signal at correct voltage and current values. The replica load 316 may balance the leakage current by replicating the load of the DAC circuitry. In an embodiment, the replica load 316 may be a diode or the like.

The current mirror implementation described herein use one stage current mirrors for illustration and explanation purposes. However, more complex precision current mirroring may also be used including passive or active cascading configurations to create a replica current based on the replica load and known common-mode voltage.

The leakage cancellation circuit 300 may receive as an input a voltage (common-mode) of the DAC, for example, from the coupled DAC output node or either reference for the LSB DAC. Using a replica load, the leakage cancellation circuit 300 may then replicate the leakage current signal and invert the signal to be 180 degrees out of phase to generate a leakage cancellation signal at transistor 310.1. The leakage cancellation signal may be injected into the DAC output node to cancel (or reduce) the leakage current signal.

In other embodiments, the leakage cancellation circuit may implement appropriate replica circuitry based on the DAC configuration to cancel the leakage current. The replica circuitry may vary to match changes in the leakage current such as code dependency. The variation may be achieved via switching in, or coupling to, appropriate replica circuitry. For example, the replica circuitry may mimic the conditions of the switch network used in the DAC. Therefore, the leakage current cancellation circuit may take into account circuit component variations such as where NMOS switches are used at low common-mode levels and PMOS devices are used at high common-mode levels.

Figure 4A:
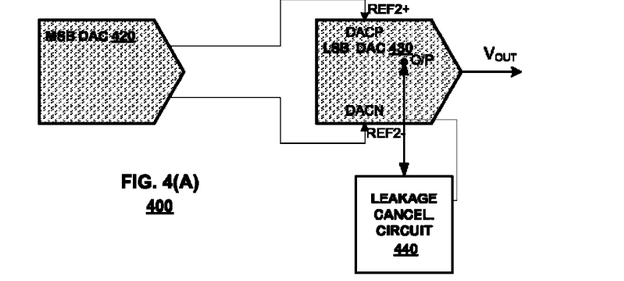
FIG. 4(A) illustrates a DAC system according to an embodiment of the present invention.

FIG. 4(A) illustrates a DAC system 400 with leakage current cancellation according to an embodiment of the present invention. The DAC system 400 may include an MSB DAC 420, an LSB DAC 430, and a current cancellation circuit 440. In this embodiment, the leakage cancellation circuit may be coupled to output node(s) in the LSB DAC 430, for example in a switch network within the LSB DAC 430, to cancel (or reduce) a leakage current signal present therein. The DAC system 400 may convert input digital word $D_{IN}$ into a converted analog voltage $V_{OUT}$.

Figure 4B:
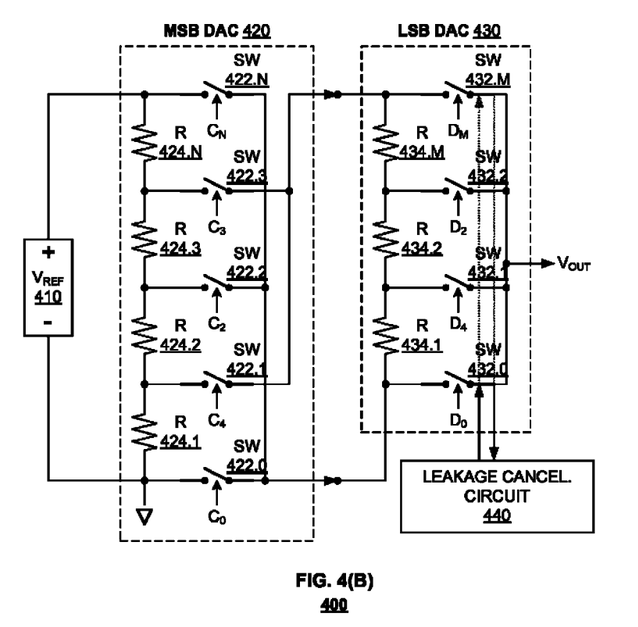
FIG. 4(B) illustrates a DAC system according to an embodiment of the present invention.

The MSB DAC 420 may convert MSB bits of a digital word to be converted to an analog voltage $V_{OUT}$. In an embodiment, the MSB DAC 420 may be provided as a string DAC as shown in FIG. 4(B). For example, the MSB DAC 420 may include a plurality of serially-connected resistors 424.1-424.N (i.e., a resistor string) and a plurality of switches 422.0-422.N. The resistors 424.1-424.N in the resistor string may be provided with equal resistance (e.g., K ohms) to operate as a voltage divider network. The plurality of switches 422.0-422.N may be coupled to the ends of the resistors. Hence, the selective coupling of the switches may provide intermediate nodes corresponding to different sections in the resistor string. The switches may be controlled by binary control signals ($C_0$-$C_N$) based on the MSBs of the digital word to be converted. Thus, the MSB DAC 420 may provide a portion of reference voltage $V_{REF}$ scaled according to the MSBs of the input digital word.

The LSB DAC 430 may be coupled to the MSB DAC 420. The LSB DAC 430 may convert LSB bits of the digital word to be converted to $V_{OUT}$. For example, the LSB DAC 430 may be provided as a string DAC as shown in FIG. 4(B). In this embodiment, the LSB DAC 430 may include a plurality of serially-connected resistors 434.1-434.M (i.e., a resistor string) and a plurality of switches 432.0-432.M. The resistors 434.1-434.M in the resistor string may be provided with equal resistance (e.g., L ohms) to operate as a voltage divider network. The output of the MSB DAC 420 may be coupled to a top and bottom end of the LSB DAC 430 resistor string. The plurality of switches 422.0-422.M may be coupled to the ends of the resistors. The switches may be controlled by binary control signals ($D_0$-$D_N$) based on the LSBs of the digital word to be converted.

The leakage cancellation circuit 440, in this embodiment, may be coupled to one or more LSB DAC 430 output nodes in a feedback loop. The leakage cancellation circuit 440 may detect and measure current leakage directly or indirectly from the coupled LSB DAC 430 output node(s). Further, the leakage cancellation circuit 440 may generate a complementary signal to the measured current leakage—a leakage cancellation signal. The leakage cancellation circuit 440 may then transmit the leakage cancellation signal to the coupled output node(s). The leakage cancellation signal may combine with the current leakage such that the effect is seen at the output node(s) and may cancel each other out due to destructive interference. In an embodiment, the leakage cancellation circuit 440 may be provided as described above in the discussion of FIG. 3.

Figure 5A:
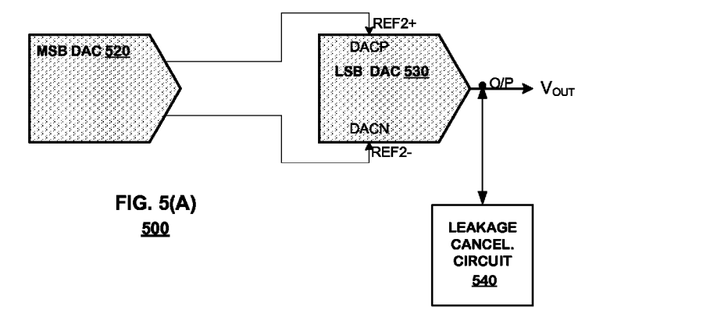
FIG. 5(A) illustrates a DAC system according to an embodiment of the present invention.

FIG. 5(A) illustrates a DAC system 500 with leakage current cancellation according to an embodiment of the present invention. The DAC system 500 may include an MSB DAC 520, an LSB DAC 530, a current cancellation circuit 540, and filter(s) 550.1, 550.2. In this embodiment, the leakage cancellation circuit may be coupled to an output nodes of the DAC system 500 to cancel (or reduce) a leakage current signal present therein. Hence, in this embodiment, the leakage current may be a combination of leakage currents from various components in the DAC system 500. The DAC system 500 may convert input digital word $D_{IN}$ into a converted analog voltage $V_{OUT}$.

Figure 5B:
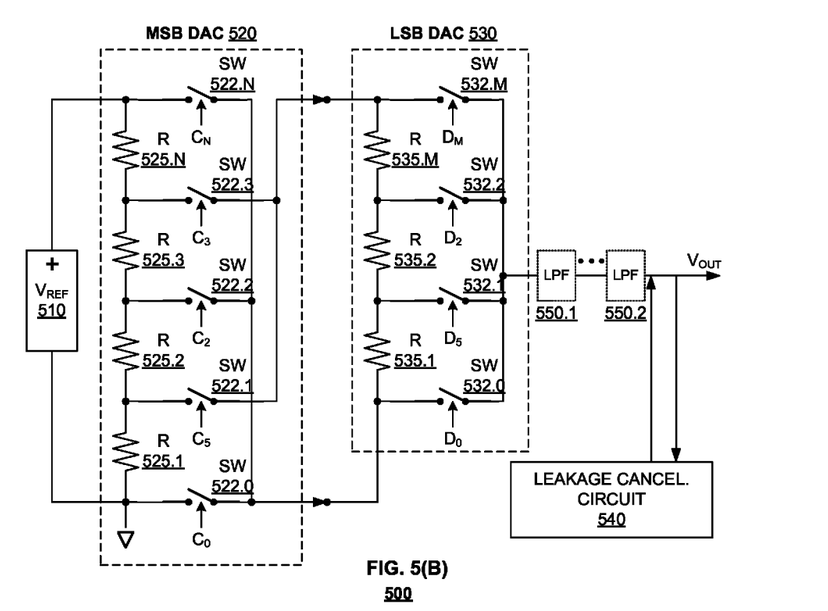
FIG. 5(B) illustrates a DAC system according to an embodiment of the present invention.

The MSB DAC 520 may convert MSB bits of a digital word to be converted to an analog voltage $V_{OUT}$. In an embodiment, the MSB DAC 520 may be provided as a string DAC as shown in FIG. 5(B). For example, the MSB DAC 520 may include a plurality of serially-connected resistors 525.1-525.N (i.e., a resistor string) and a plurality of switches 522.0-522.N. The resistors 525.1-525.N in the resistor string may be provided with equal resistance (e.g., K ohms) to operate as a voltage divider network. The plurality of switches 522.0-522.N may be coupled to the ends of the resistors. Hence, the selective coupling of the switches may provide intermediate nodes corresponding to different sections in the resistor string. The switches may be controlled by binary control signals ($C_0$-$C_N$) based on the MSBs of the digital word to be converted. Thus, the MSB DAC 520 may provide a portion of reference voltage $V_{REF}$ scaled according to the MSBs of the input digital word.

The LSB DAC 530 may be coupled to the MSB DAC 520. The LSB DAC 530 may convert LSB bits of the digital word to be converted to $V_{OUT}$. For example, the LSB DAC 530 may be provided as a string DAC as shown in FIG. 5(B). In this embodiment, the LSB DAC 530 may include a plurality of serially-connected resistors 535.1-535.M (i.e., a resistor string) and a plurality of switches 532.0-532.M. The resistors 535.1-535.M in the resistor string may be provided with equal resistance (e.g., L ohms) to operate as a voltage divider network. The output of the MSB DAC 520 may be coupled to a top and bottom end of the LSB DAC 530 resistor string. The plurality of switches 522.0-522.M may be coupled to the ends of the resistors. The switches may be controlled by binary control signals ($D_0$-$D_N$) based on the LSBs of the digital word to be converted.

One or more filters in series may be provided optionally to refine the analog signal at the DAC system 500 output, $V_{OUT}$. For example, filters 550.1, 550.2 may be implemented at the DAC system 500 output. Filter(s) 550.1, 550.2 may be low pass filters, such as passive (RC) filter(s) or other suitable filter topologies, that have a minimal (i.e., negligible) impact on the leakage current cancellation scheme but may improve DAC transient performance if/as desired.

The leakage cancellation circuit 540, in this embodiment, may be coupled to the DAC system 500 output node ($V_{OUT}$) in a feedback loop. The leakage cancellation circuit 540 may detect and measure current leakage directly or indirectly from the coupled output node. Further, the leakage cancellation circuit 540 may generate a complementary signal to the measured current leakage—a leakage cancellation signal. The leakage cancellation circuit 540 may then transmit the leakage cancellation signal to the coupled output node. The leakage cancellation signal may combine with the current leakage such that the effect is seen at the output node and may cancel each other out due to destructive interference. In an embodiment, the leakage cancellation circuit 440 may be provided as described above in the discussion of FIG. 3.

DAC systems described herein may have been illustrated as dual-string DACs; however, DAC systems in embodiments of the present invention may be expanded to include larger multi-string DAC configurations (e.g., three string, four string, etc.), and the leakage cancellation scheme described herein may be implemented with other DAC configurations. For example, the leakage current cancellation scheme may be used in conjunction with multi-string DAC architectures described in U.S. Pat. No. 5,969,657, U.S. Pat. No. 7,136,002, and U.S. Pat. No. 6,914,547. Furthermore, various embodiments described herein may be used in combination. Hence, the leakage cancellation circuit may implement appropriate replica circuitry based on the DAC configuration to cancel the leakage current. The replica circuitry may vary to match changes in the leakage current, for example due to code dependency. The variation may be achieved via switching in, or coupling to, appropriate replica circuitry. Therefore, the leakage current cancellation circuit may take into account circuit component variations such as where NMOS switches are used at low common-mode levels and PMOS devices are used at high common-mode levels. Furthermore, various embodiments described herein may be used in conjunction.

Several embodiments of the invention are specifically illustrated and/or described herein. However, it will be appreciated that modifications and variations of the invention are covered by the above teachings and within the purview of the appended claims without departing from the spirit and intended scope of the invention.

In other instances, well-known operations, components and circuits have not been described in detail so as not to obscure the embodiments. For example, two terminal resistors described herein are for description simplicity; however, two terminal resistors described herein may be generalized as impedance elements as is known to those skilled in the art. For example, three terminal impedance elements such as back-plate elements or three terminal resistors may also be used and are not described here in detail so as not to obscure the embodiments. Moreover, embodiments of the present invention are described herein using resistor strings for illustration purposes; however, embodiments of the present invention may be implemented with other impedance string schemes. For example, MOS structures biased in un-saturated operations may be utilized in impedance string schemes. It can be appreciated that the specific structural and functional details disclosed herein may be representative and do not necessarily limit the scope of the embodiments.

We claim:

1. A string digital to analog converter (DAC), comprising:
   at least two impedance strings selectively coupled to each other via switches; and
   a leakage cancellation circuit coupled to an output node to replicate a leakage current present at the output node based on a detected voltage at the output node, to generate a complementary signal of the leakage current and to output the complementary signal.

2. The string DAC of claim 1, wherein the output node is coupled to an impedance element terminal in one of the impedance strings.

3. The string DAC of claim 2, wherein the output node coupled to an impedance element terminal in one of the impedance strings corresponding to most significant bits (MSBs) of the string DAC.

4. The string DAC of claim 2, wherein the output node is coupled to an impedance element terminal in one of the impedance strings corresponding to least significant bits (LSBs) of the string DAC.

5. The string DAC of claim 1, wherein the output node is an output node of the string DAC.

6. The string DAC of claim 1, wherein the switch comprises a pair of transistors.

7. The string DAC of claim 6, wherein the switch comprises a MOS transistor.

8. The string DAC of claim 1, wherein the leakage cancellation circuit includes an op-amp.

9. The string DAC of claim 1, wherein the leakage cancellation circuit includes at least one current mirror.

10. The string DAC of claim 1, wherein the leakage cancellation circuit includes a load to balance the leakage current by replicating the string DAC's load.

11. The string DAC of claim 1, wherein the impedance strings comprise series-coupled resistors.

12. The string DAC of claim 1, wherein a voltage is detected at the output node to replicate the leakage current.

13. The string DAC of claim 1, wherein the leakage cancellation circuit to output the complementary signal at the output node.

14. A method, comprising:
   detecting a voltage signal at an output node in a multi-string DAC;
   replicating a leakage current at the output node based on the detected voltage;
   generating a cancellation signal that is complementary to the leakage current; and
   outputting the cancellation signal so that the leakage current and the cancellation signal destructively interfere.

15. The method of claim 14, wherein the cancellation signal is coupled to an impedance element terminal in an MSB string of the multi-string DAC.

16. The method of claim 14, wherein the cancellation signal is coupled to an impedance element terminal in an LSB string of the multi-string DAC.

17. The method of claim 14, wherein the cancellation signal is coupled to the multi-string DAC output.

18. The method of claim 14, further comprises detecting voltages at a plurality of output nodes.

* * * * *